(12) United States Patent
Hallquist

(10) Patent No.: US 9,098,657 B2
(45) Date of Patent: Aug. 4, 2015

(54) CONTACT SURFACE DEFINITION CREATION INVOLVING LOW ORDER AND QUADRATIC FINITE ELEMENTS IN A NUMERICAL SIMULATION OF AN IMPACT EVENT

(71) Applicant: Livermore Software Technology Corporation, Livermore, CA (US)

(72) Inventor: John O. Hallquist, Livermore, CA (US)

(73) Assignee: Livermore Software Technology Corp., Livermore, CA (US)

( * ) Notice: Subject to any disclaimer, the term of this patent is extended or adjusted under 35 U.S.C. 154(b) by 447 days.

(21) Appl. No.: 13/760,005

(22) Filed: Feb. 5, 2013

(65) Prior Publication Data

US 2014/0222395 A1 Aug. 7, 2014

(51) Int. Cl.
*G06G 7/48* (2006.01)
*G06F 17/50* (2006.01)
*G06F 17/10* (2006.01)

(52) U.S. Cl.
CPC ............ *G06F 17/5018* (2013.01); *G06F 17/10* (2013.01)

(58) Field of Classification Search
CPC ...... G06F 17/5018; G06F 17/10; G06F 17/50
See application file for complete search history.

(56) References Cited

U.S. PATENT DOCUMENTS

| | | | | |
|---|---|---|---|---|
| 2005/0091017 | A1* | 4/2005 | Namiki et al. | 703/8 |
| 2005/0171745 | A1* | 8/2005 | Breitfeld et al. | 703/2 |
| 2010/0286966 | A1* | 11/2010 | Hallquist | 703/2 |
| 2012/0152007 | A1* | 6/2012 | Holmes et al. | 73/112.01 |
| 2012/0226482 | A1* | 9/2012 | Wu et al. | 703/2 |
| 2012/0323536 | A1* | 12/2012 | Borrvall | 703/1 |
| 2013/0185030 | A1* | 7/2013 | Hallquist | 703/2 |

* cited by examiner

*Primary Examiner* — Kandasamy Thangavelu
(74) *Attorney, Agent, or Firm* — Roger H. Chu

(57) ABSTRACT

Methods and systems for creating a contact surface definition involving lower order and quadratic finite elements (QFE) in a FEA model used for numerically simulating an impact event are disclosed. FEA model is organized by one or more groups of finite elements. Each group represents one of the product's parts and is identified by a part ID. Further, the FEA model is configured with one or more contact surface definitions for detecting contacts amongst the parts due to the impact event. For each determined group that is determined to contain QFE, a new group is created. The new group is associated with a unique part ID. Contact segments for the new group are then generated in accordance with a set of predefined rules for subdividing one or more geometric shapes associated with the QFE. Contact surface definitions are updated by replacing each determined group with the new group.

16 Claims, 13 Drawing Sheets

| ID1 | ID2 | ID3 | | |
|---|---|---|---|---|
| | | | | |
| | | | | IDn |

420

US 9,098,657 B2

CONTACT SURFACE DEFINITION CREATION INVOLVING LOW ORDER AND QUADRATIC FINITE ELEMENTS IN A NUMERICAL SIMULATION OF AN IMPACT EVENT

FIELD OF THE INVENTION

The present invention generally relates to computer aided engineering analysis, more particularly to methods and systems for creating a contact surface definition involving a mixture of low order linear and quadratic finite elements in a finite element analysis model representing a product used in a numerical simulation of an impact event.

BACKGROUND

Computer aided engineering (CAE) has been used for supporting engineers in many tasks. For example, in a structure or product design procedure, CAE analysis, in particular finite element analysis (FEA), has often been employed to evaluate responses (e.g., stresses, displacements, etc.) under various loading conditions (e.g., static or dynamic).

FEA is a computerized method widely used in industry to simulate (i.e., model and solve) engineering problems relating to complex products or systems (e.g., cars, airplanes, etc.) such as three-dimensional non-linear structural design and analysis. FEA derives its name from the manner in which the geometry of the object under consideration is specified. The geometry is defined by elements and nodes. There are many types of elements, solid elements for volumes or continua, shell or plate elements for surfaces and beam or truss elements for one-dimensional structure objects. One of the most challenging simulations is related to contacts between two or more locations of the FEA model.

Simulating contacts are routinely used in impact events of two or more objects, for example, automobile crash, sheet metal forming, etc. To numerically simulate such event, prior art approaches have used a technique referred to as surface-to-surface contact because the majority of the finite element models comprise two-dimensional 3- or 4-node low order shell or solid elements with their outer surface represented by either triangles or quadrilaterals. In order to perform a surface-to-surface contact simulation, the user needs to specify which surfaces in a finite element analysis model are to be included. In certain circumstance, each contact surface may fold and contact itself during the impact event. To simplify user input, modern approach for such a situation (self contacts) is to include all surfaces in one single self-contact surface definition which, for example, is commonly performed in car crash simulations (i.e., designating the entire vehicle as one single self-contact surface).

For computation efficiency, the finite element analysis model comprises non-quadratic low-order finite elements (i.e., finite elements defined by corner nodes only, for example, 3-node triangular 101, 4-node quadrilateral 102, 4-node tetrahedral 103, 8-node hexahedral elements 104 shown in FIG. 1). With the advent of faster computer systems, some users are desirous of including quadratic finite elements (i.e., finite elements 202, 204, 205, 252, 254 defined by more than just corner nodes shown in FIGS. 2A and 2B) in the finite element model. However, prior approaches of defining contact surfaces cannot accommodate quadratic finite elements without a significant degradation in performance. Since contact treatment can be nearly as costly as processing the elements and nodes in a realistic numerical simulation, many man years have been expended to ensure that contact is as optimized as possible to reduce computer run times. Closed form solutions for finding contact points are used for the lower order segments and segments of the same type are processed together to increase efficiency. Accurate and robust closed form solutions for finding the contact point are not available for quadratic finite elements, which leads to an iterative solution for the contact point. Such iterative solutions are not robust insofar as the surfaces can become very distorted due to the severe loadings seen in impact simulations. The inclusion of both lower and higher order contact surface segments (i.e., linear and quadratic finite elements) within the same contact surface definition creates interactions between the different segment types that require special branching in the computer software that ultimately destroys computation efficiency. The branching requires checking, for example, 1) lower order 3- and 4-node segments in contact, 2) quadratic 6- and 8-node segments in contact, and 3) lower order and quadratic segments in contact.

Furthermore, an interface force database displays surface pressure and shear stress distributions throughout the contact surface. This database is written at time intervals defined by the user for post-processing in multiple software products that presently lack the facility of treating quadratic contact surfaces while rendering the data. Therefore, it is imperative to preserve the current database in its present form to enable visualization of the contact stress distributions.

It would, therefore, be desirable to have methods and systems for creating a contact surface definition involving a mixture of quadratic and lower order linear finite elements in a finite element model used in numerical simulations of an impact event.

SUMMARY

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for creating a contact surface definition involving quadratic finite elements in a finite element analysis (FEA) model used for numerically simulating an impact event are disclosed. According to one aspect of the present invention, a finite element analysis model representing a product to be used in a time-marching simulation of an impact event is received in a computer system having a FEA application module installed thereon. The FEA model is organized by one or more groups of finite elements including linear and quadratic finite elements. Each group is designated to represent one of the product's parts and is identified by a part identifier (ID). Further, the FEA model is configured with one or more contact surface definitions for detecting contacts amongst the parts due to the impact event.

One or more groups that contains quadratic finite elements (QFE) is determined (i.e., detected and identified). For each determined group, a new group is created. The new group is associated with a unique part ID based on each determined group. Contact segments for the new group are then generated in accordance with a set of predefined rules for subdividing one or more geometric shapes associated with the QFE in each determined group. Element properties of the QFE are assigned to the new group, and the contact surface definitions are updated by replacing each determined group with the new group. Finally, the time-marching simulation is conducted using the FEA model along with the updated contact surface definitions to obtain simulated structural behaviors of the product due to the impact event.

The present invention requires no additional user input comparing to prior art approaches. Either the entire FEA model is included in a contact surface definition, or a subset of the FEA model is specified by listing part IDs (i.e., groups) in a contact surface definition. Contact segments for any quadratic finite element in any contact surface definition are generated automatically. Furthermore, the present invention enables the use of quadratic finite elements within a realistic numerical simulation of an impact event in a way that also allows the simulation results to be rendered after the analysis is complete. Moreover, the present invention makes changes at the onset, not during the time-marching simulation hence making the present invention very efficient.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-9. However, those skilled in the art will readily appreciate that the detailed description given herein with respect to these figures is for explanatory purposes as the invention extends beyond these limited embodiments.

Figure 1:
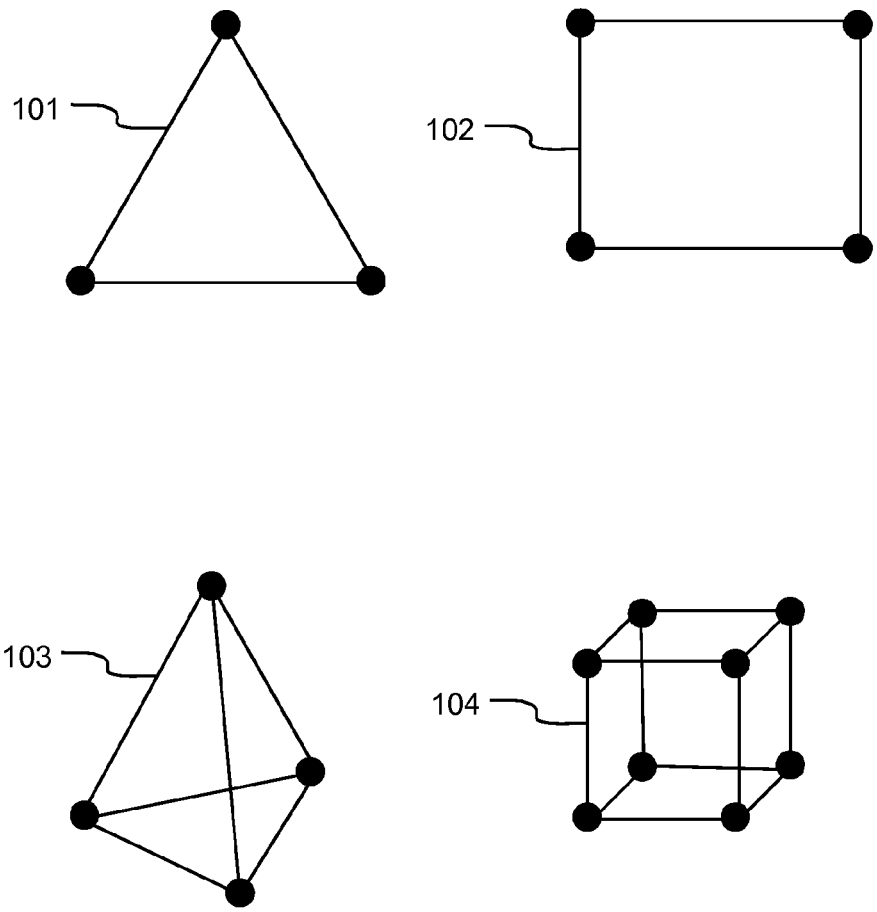
FIG. 1 is a diagram showing various exemplary non-quadratic low-order finite elements used for numerically simulating an impact event.

Referring first to FIG. 1, there are shown exemplary low-order or linear finite elements 101-104. Finite element 101 contains a 3-node contact segment, while finite element 102 contains a 4-node contact segment. Similarly, finite element 103 contains four 3-node contact segments (i.e., exterior surfaces of the tetrahedral) and finite element 104 contains six 4-node contact segments (i.e., exterior surfaces of the hexahedral). A 3-node contact segment has a triangular shape while a 4-node contact segment has a quadrilateral shape.

Figure 2A:
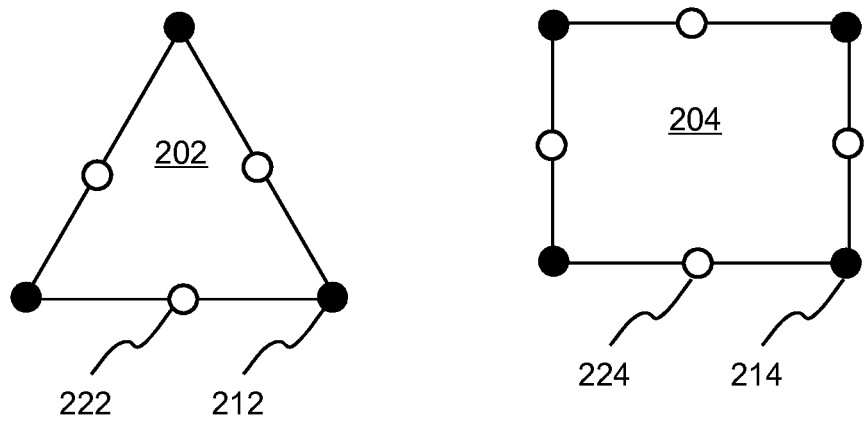
FIGS. 2A-2B are diagrams showing various exemplary quadratic finite elements used in a time-marching simulation of an impact event, according to an embodiment of the present invention.
Figure 2A:
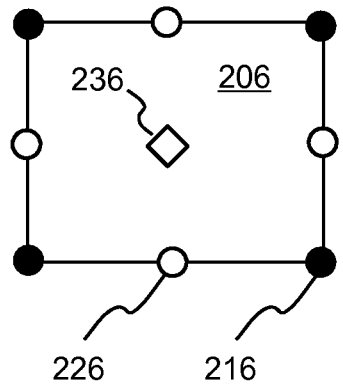

Various exemplary quadratic 2-D finite elements are shown in FIG. 2A. Each of them contains more than just the corner nodes 212, 214, 216. For example, 6-node triangular element 202 comprises three corner nodes 212 (shown as solid circles) and three mid-edge nodes 222 (shown as hollow circles), 8-node quadrilateral element 204 contains four corner nodes 214 and four mid-edge nodes 224, and a 9-node quadrilateral element 206 contains a center node 236 (shown as hollow diamond) in additional to the corner 216 and mid-edge nodes 226.

Figure 2B:
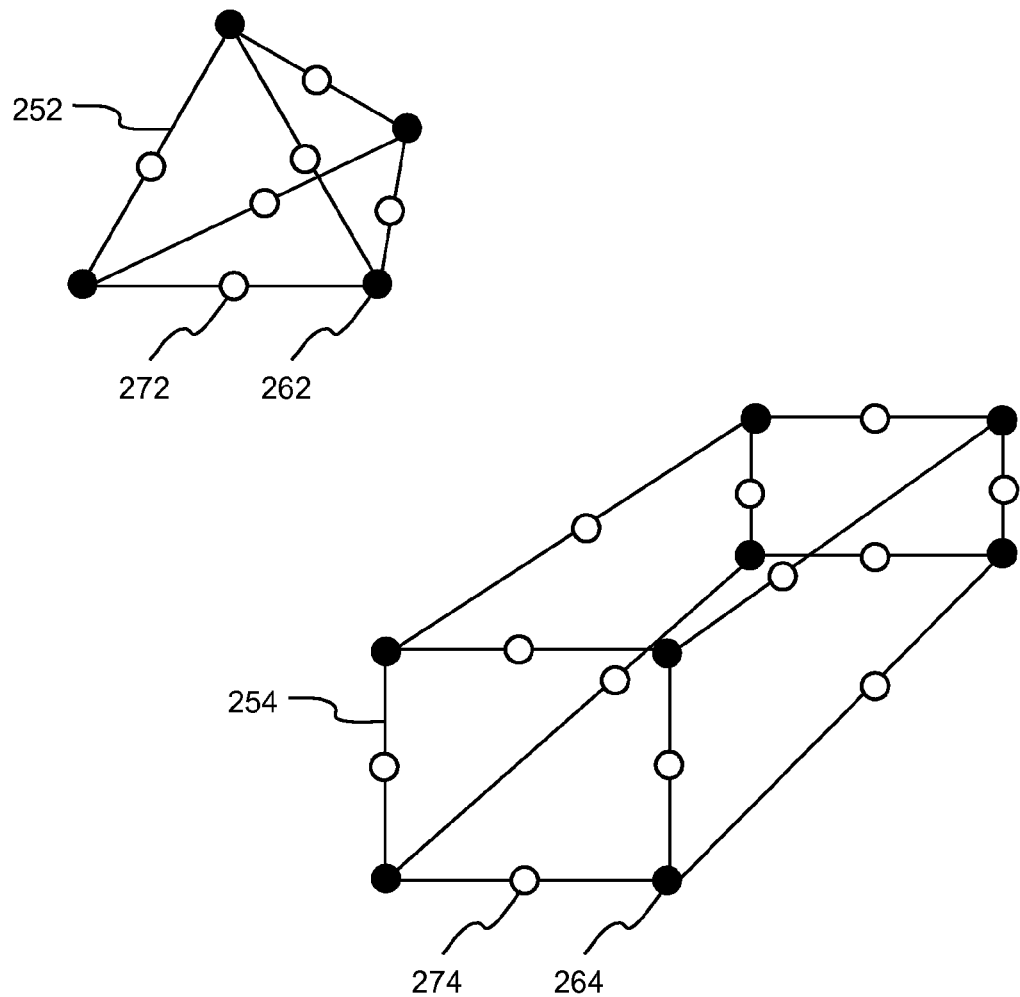

FIG. 2B shows a couple of exemplary three-dimensional (3-D) quadratic finite elements: 10-node tetrahedral element 252 having four corner nodes 262 (solid circles) and six mid-edge nodes 272 (hollow circles), and 20-node hexahedral element 254 having 8 corner nodes 264 (solid circles) and 12 mid-edge nodes 274 (hollow circles). It is evident for one of ordinary skill in the art that each 2-D element possesses a geometric shape (e.g., triangle, quadrilateral, etc.) as the shape of a surface, which is also possessed in each face or surface of the outer boundary of a 3-D element.

Figure 3:
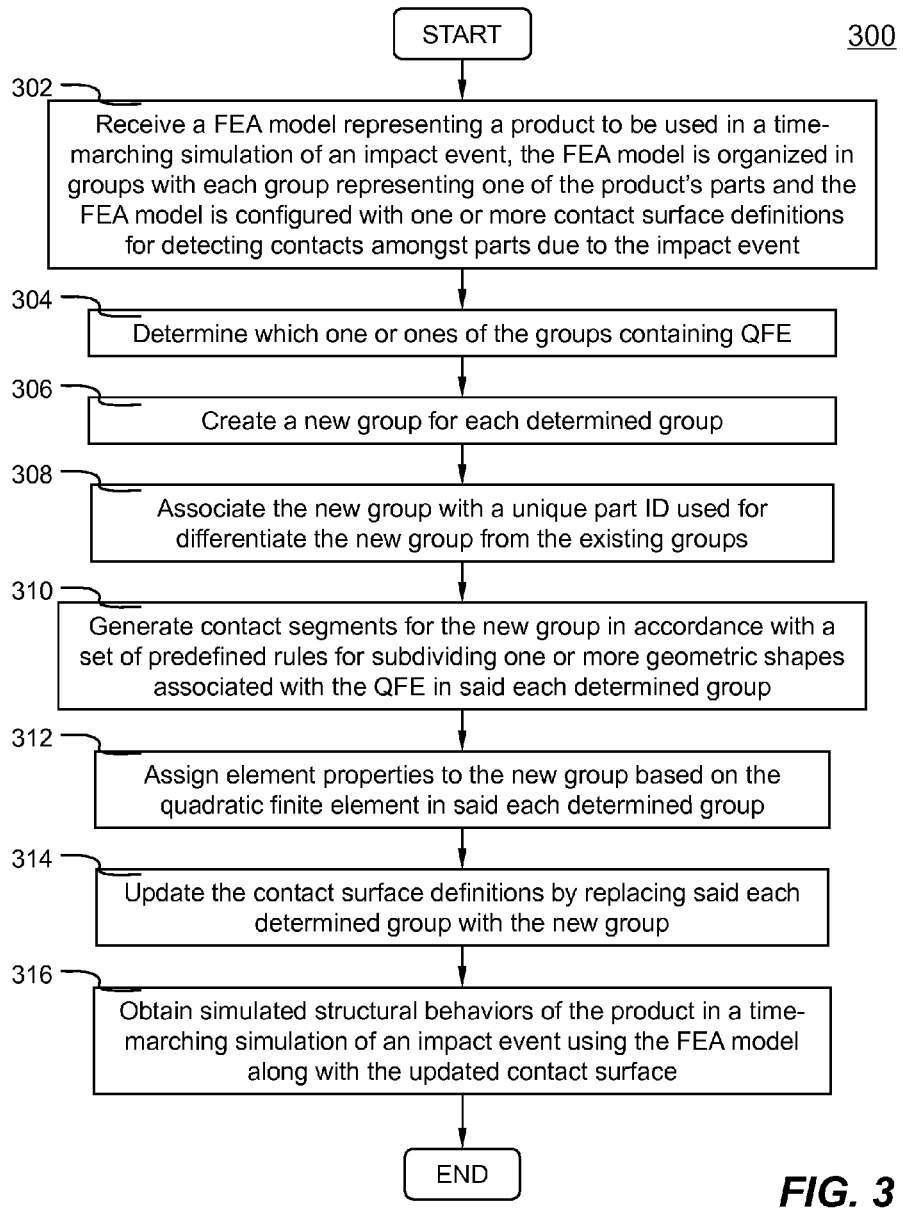
FIG. 3 is a flowchart illustrating an exemplary process of numerically simulating structural behaviors of a product in an impact event, according to an embodiment of the present invention.

Referring now to FIG. 3, it shows a flowchart illustrating an exemplary process 300 of numerically simulating structural behaviors of a product in an impact event, according to an embodiment of the present invention. Process 300 is preferably implemented in software.

Process 300 starts by receiving a finite element analysis (FEA) model representing a product (e.g., car, truck, motorcycle, airplane, etc.) in a computer system (e.g., computer system 900 in FIG. 9) at step 302. The FEA model is used for obtaining structural behaviors of the product in an impact event in a time-marching simulation. The computer system has a finite element analysis application module installed thereon.

Figures 4A, 4B:
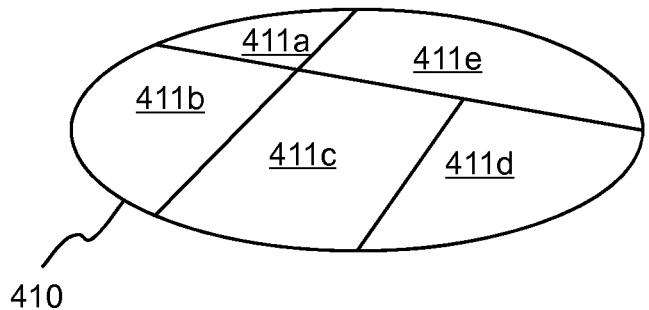
FIG. 4A is a schematic diagram showing a first exemplary FEA model being organized in groups, according to an embodiment of the present invention.
FIG. 4B is a schematic diagram showing a second exemplary FEA model being organized in groups, according to an embodiment of the present invention.

The FEA model is organized in groups of finite elements with each group representing one of the product's parts. Each group is assigned a part identifier (ID). FIGS. 4A and 4B show two exemplary FEA models 410, 420 that are organized in groups. For illustration simplicity, the exemplary FEA models are drawn in two-dimensions (2-D). For those of ordinary skill in the art would know that the FEA model can be in three-dimensions (3-D) with either 2-D or 3-D finite elements. First FEA model 410 is organized with five groups 411a-411e. Second FEA model 420 contains n groups marked as part IDs: "ID1", "ID2", . . . "IDn". Grouping substantially similar finite elements provide benefits of simplifying the definition of element properties. Instead of specifying properties for an individual finite element, a group of finite elements can be assigned properties. Also part ID can link a group of finite elements to a physical part in a product, for example, fender, hood, trunk, etc.

Furthermore, the FEA model is configured with one or more contact surface definitions used in time-marching simulation for detecting contacts amongst parts due to the impact event. Each contact surface definition includes a list of at least one group. Examples of contact surface definitions are shown in FIGS. 5A-5B.

Figure 5A:
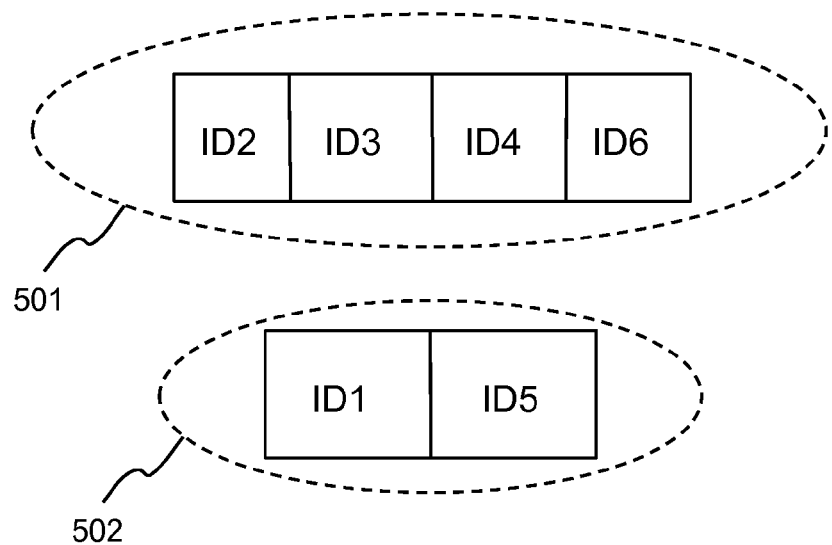
FIG. 5A is a schematic diagram showing an exemplary FEA model that contains two contact surfaces.
Figure 5B:
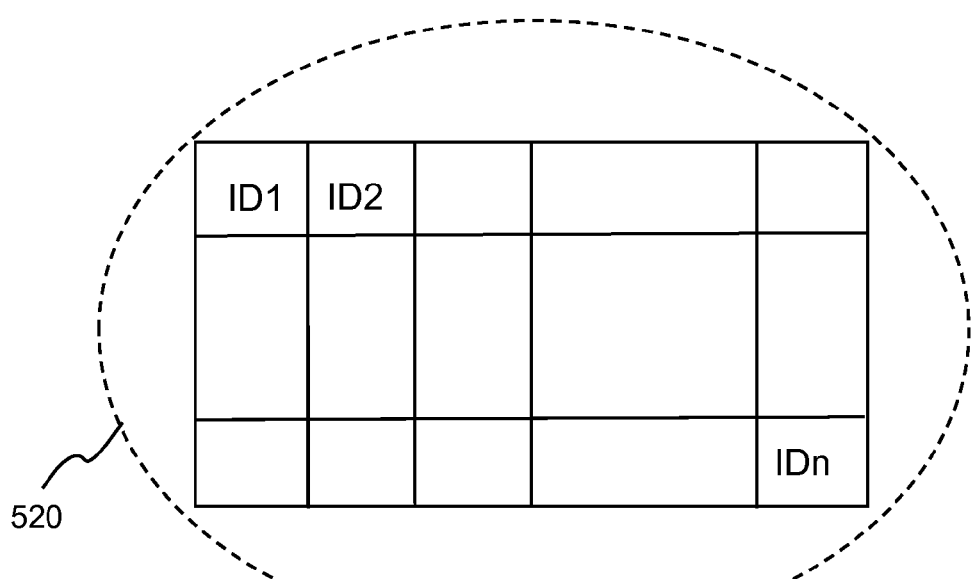
FIG. 5B is a schematic diagram showing an exemplary FEA model that contains only one contact surface.

FIG. 5A shows an exemplary FEA model containing two contact surfaces 501-502 (dotted line ovals are shown to indicate the groups included therein). Contact surface definition for the first contact surface 501 includes four groups with part IDs—"ID2", "ID3", "ID4 and "ID6". Contact surface definition for the second contact surface 502 contains two groups with part IDs—"ID1" and "ID5". A second example shown in FIG. 5B, there is only one contact surface 520, which includes n groups with part IDs—"ID1", "ID2", . . . "IDn". Contacts between parts can happen between two contact surfaces 501 and 502. Or contacts can occur amongst the elements within a contact surface itself. In the case of a single contact surface 520, the contact surface is generally referred to as a single self-contact surface. In one implementation, when no group is defined in the contact surface definition then by default all groups in the FEA model are included in a single contact surface definition.

Referring back to FIG. 3, any group that contains quadratic finite elements (e.g., various exemplary quadratic finite elements shown in FIGS. 2A-2B) are determined or identified at step 304. For each determined group, a new group is created at step 306. Then, at step 308, a unique part ID derived from each determined group is associated with the new group. Unique part ID is used for differentiating the new group from existing groups. An example of creating unique part ID is to add a prefix or a postfix to the part ID of the determined group. Next, at step 310, contact segments (i.e., 3-node or 4-node contact segments) are generated for the new group in accordance with a set of predefined rules for subdividing one or more geometric shapes associated with the quadratic finite elements in each determined group.

Figure 6A:
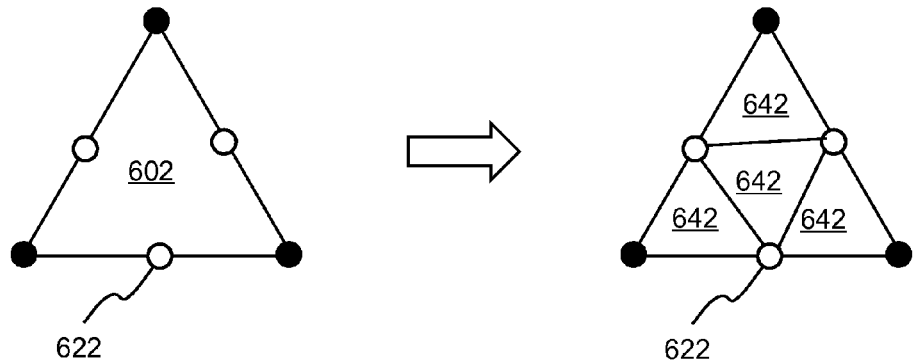
FIGS. 6A-6D are diagrams showing various exemplary partition schemes of creating contact segments from a geometric shape associated with each quadratic finite element, according to an embodiment of the present invention.
Figure 6B:
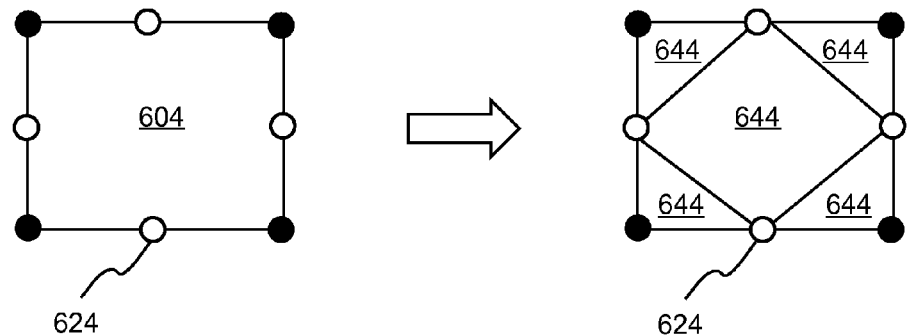

The set of predefined rules includes at least the following exemplary partition schemes. Shown in FIGS. 6A-6B is a first exemplary partition scheme. A 6-node triangular element 602 with the mid-edge nodes 622 connected to create four contact segments 642. A 8-node quadrilateral element 604 is subdivided into five contact segments 644 by connecting mid-edge nodes 624.

Figure 6C:
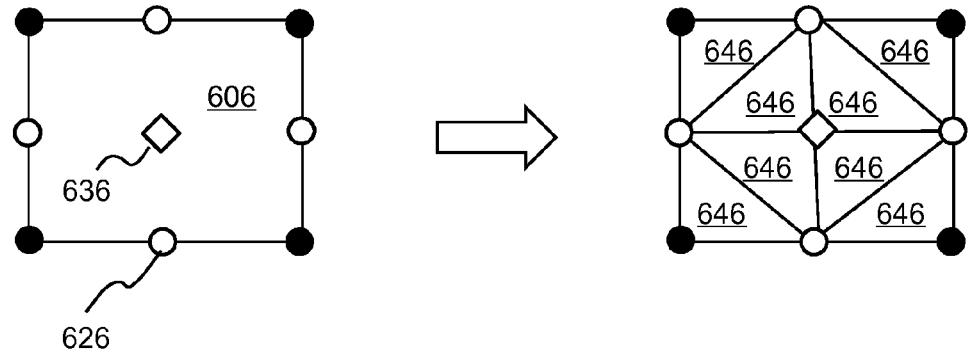
Figure 6D:
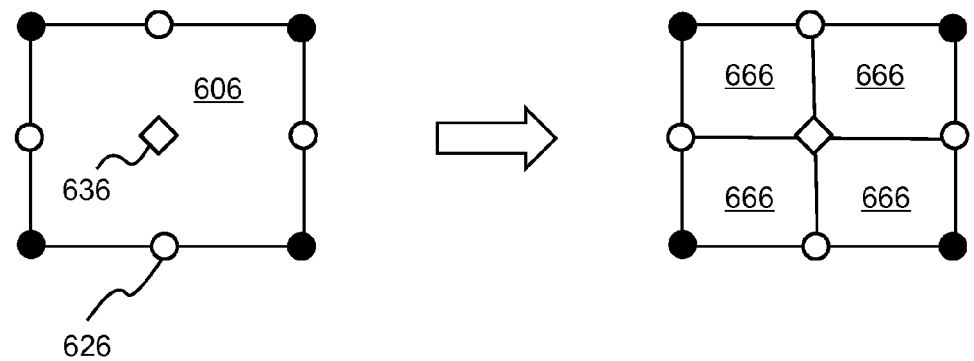

FIG. 6C show a second partition scheme. A 9-node quadrilateral element 606 is subdivided into 8 contact segments 646 by connected mid-edge nodes and each mid-edge node 626 with the center node 636. A third partition scheme is shown in FIG. 6D, in which the same 9-node quadrilateral element 606 is subdivided into four contact segments 666 by connecting each of the mid-edge nodes 626 with the center node 636. For those having ordinary skill in the art would know that the exemplary partition schemes shown in FIGS. 6A-6D can also be applied to each face of a 3-D quadratic finite element, because each face is substantially similar to a 2-D element.

Element properties of the quadratic finite elements are assigned to the new group at step 312. The element properties include, but are not limited to, Young's modulus, Poisson's ratio, thickness, and the likes. At step 314, the contact surface definitions are updated by replacing any group containing quadratic finite elements with the new group.

Finally at step 316, numerically simulated structural behaviors of the product in an impact event (e.g., car crash simulation) are obtained using the finite element analysis model along with the contact surface definitions. Process 300 ends thereafter.

The following example demonstrates steps 304-314 of process 300. Parts (i.e., groups), which are included in the contact treatment, are stored with each contact surface definition. If no parts are defined in the contact surface definition then by default all parts in the FEA model are stored within the single contact surface definition.

Loop through the parts list. Assume there are n parts so the loop is over n parts with identifiers (ID's): ID1, ID2, ID3, . . . through IDn. For each part identifier (IDk (where k is from 1 to n inclusive) processed, check to see if it is treated in contact. If so, and if the part consists of quadratic finite elements, create a new part with a unique, part ID, IDkNEW, which overlays the external quadratic surface with 3 and 4 node segments based on a set of predefined rules. Assign to this part ID elastic properties, i.e., a Young's modulus and Poisson's ratio, based on the constitutive model of the quadratic segments, which are overlaid by the new part. Assign a thickness to the new part ID based on the quadratic surface thickness. Finally, within the part list for contact replace IDk with IDkNEW to effectively eliminate the quadratic segments of part IDk from the contact treatment.

To demonstrate the present invention, an exemplary FEA model representing a hollow square column being crushed in a time-marching simulation of an impact event is shown in FIGS. 7A-7B and 8A-8B.

Figure 7A:
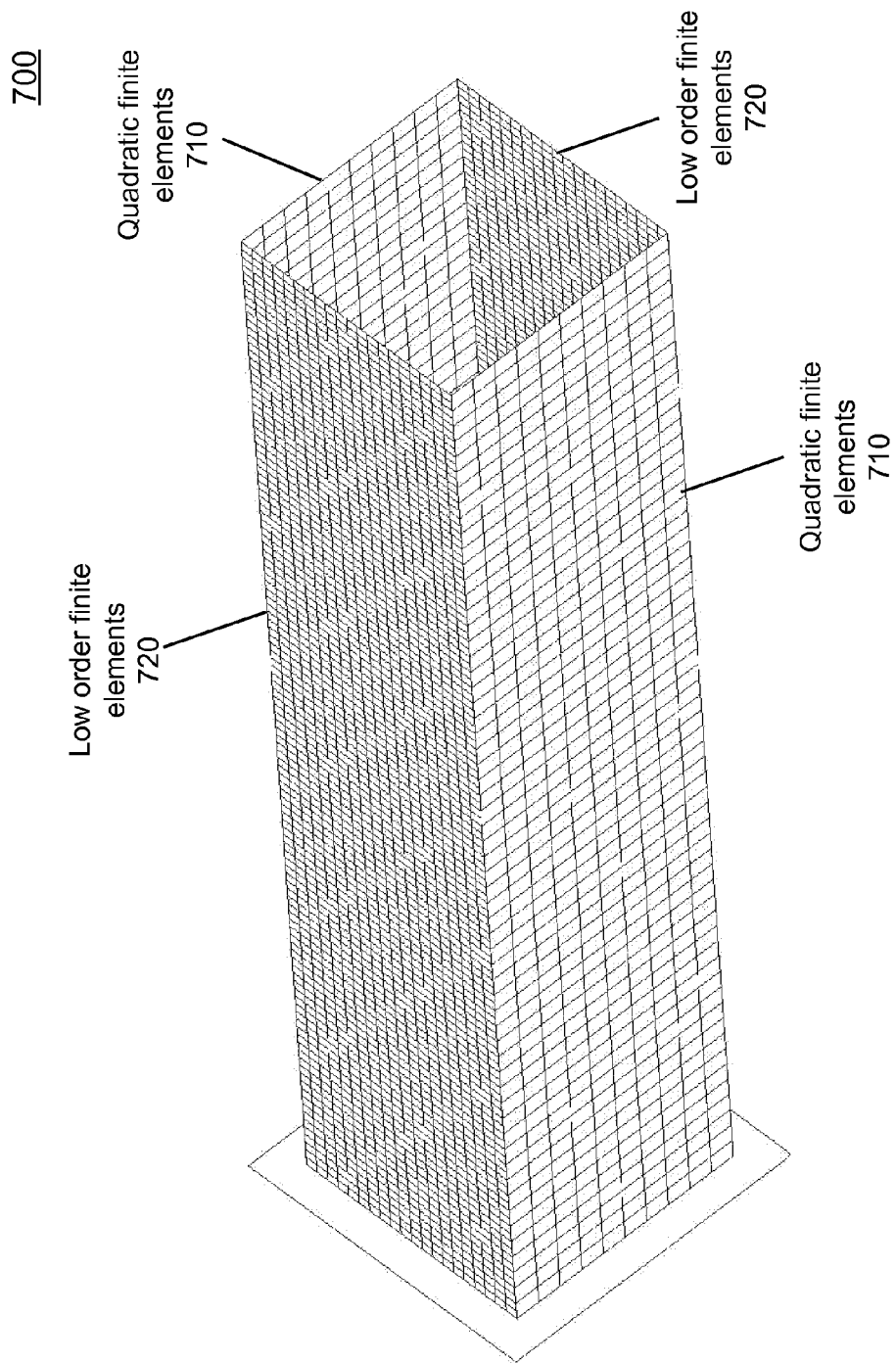
FIG. 7A is a diagram showing an exemplary FEA model containing both quadratic finite elements (large) and low order linear finite elements (small) in an original undeformed configuration, according to an embodiment of the present invention.

In FIG. 7A, the exemplary FEA model in its original undeformed configuration 700 is shown. The first FEA model contains both low order linear (small) and quadratic (large) finite elements. Lower density mesh 710 represents quadratic finite elements, while higher density mesh 720 represents low order linear finite elements.

Figure 7B:
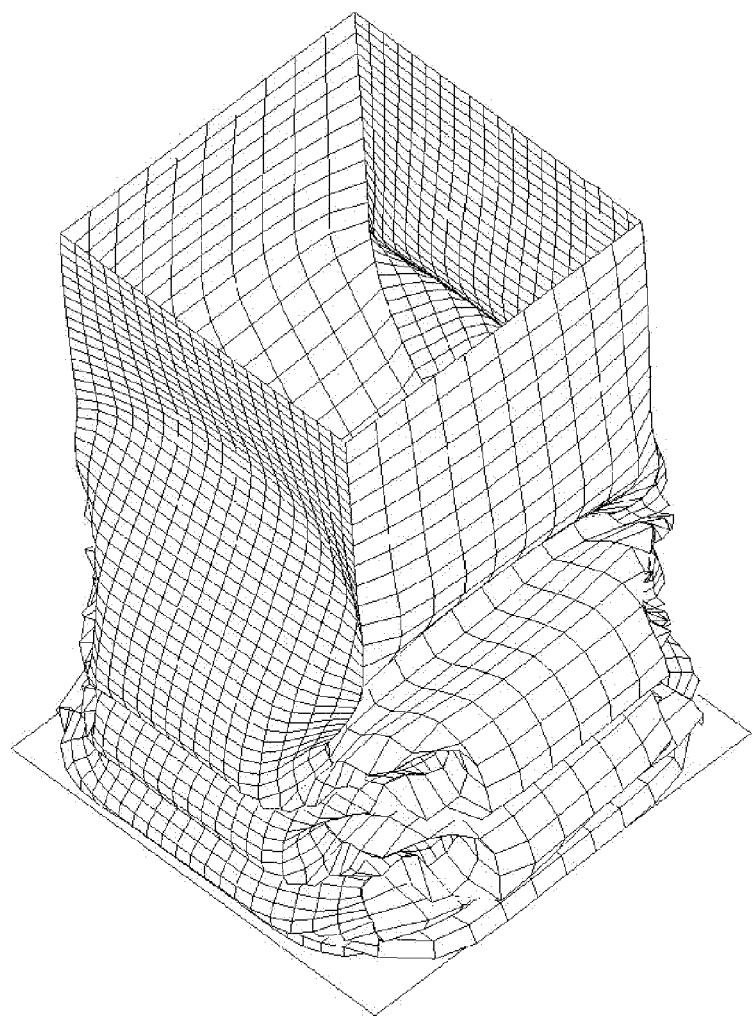
FIG. 7B is a diagram showing deformed structure of the FEA model of FIG. 7A due to an impact event.

The deformed configuration 750 after the impact event is shown in FIG. 7B. It can be seen that the column is crushed in the impact event, contact between finite elements are detected in the time-marching simulation.

Figure 8A:
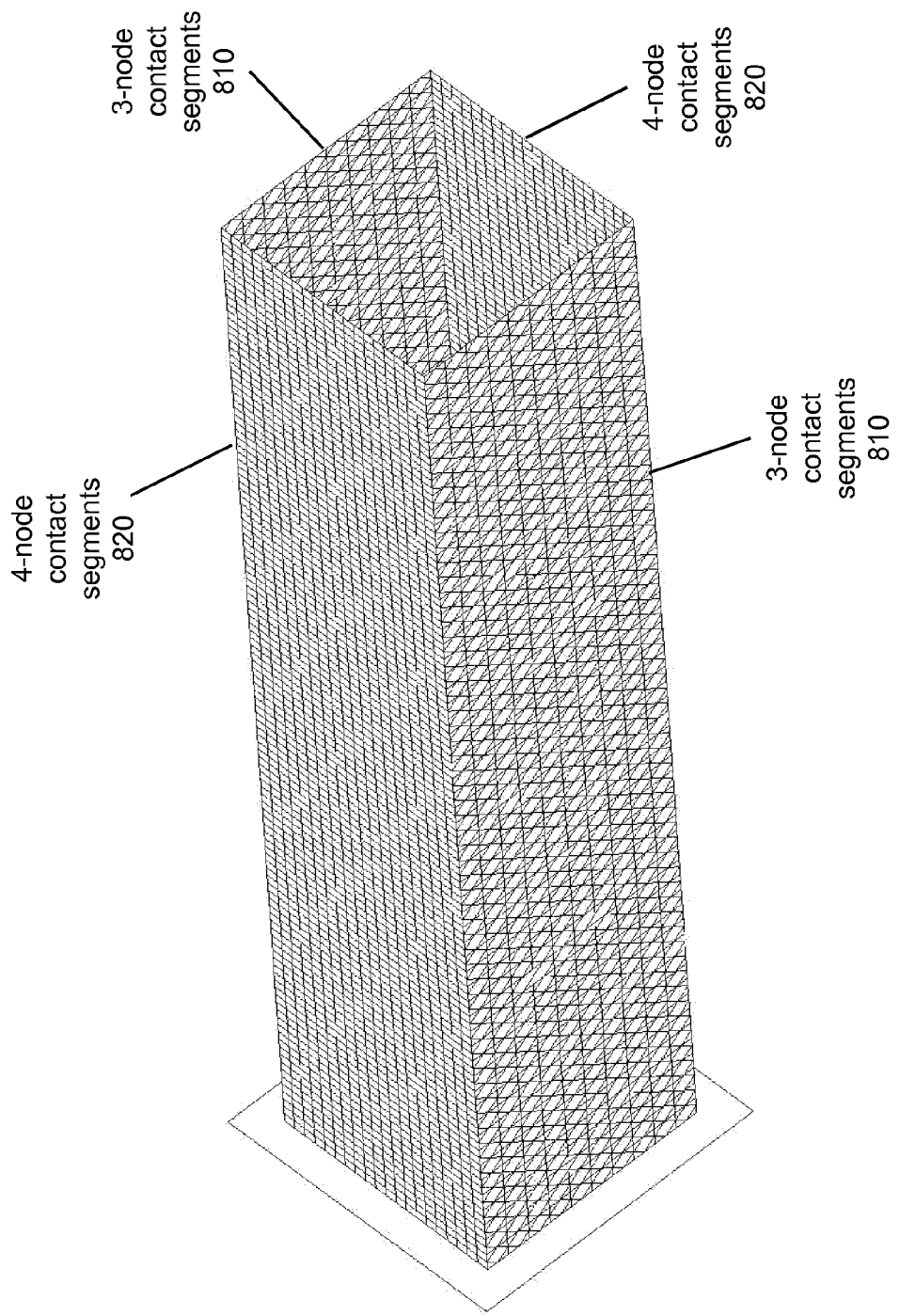
FIG. 8A is a diagram showing exemplary contact segments of the FEA model of FIG. 7A in undeformed configuration, the 3-node contact segments are generated from the quadratic finite elements.
Figure 8B:
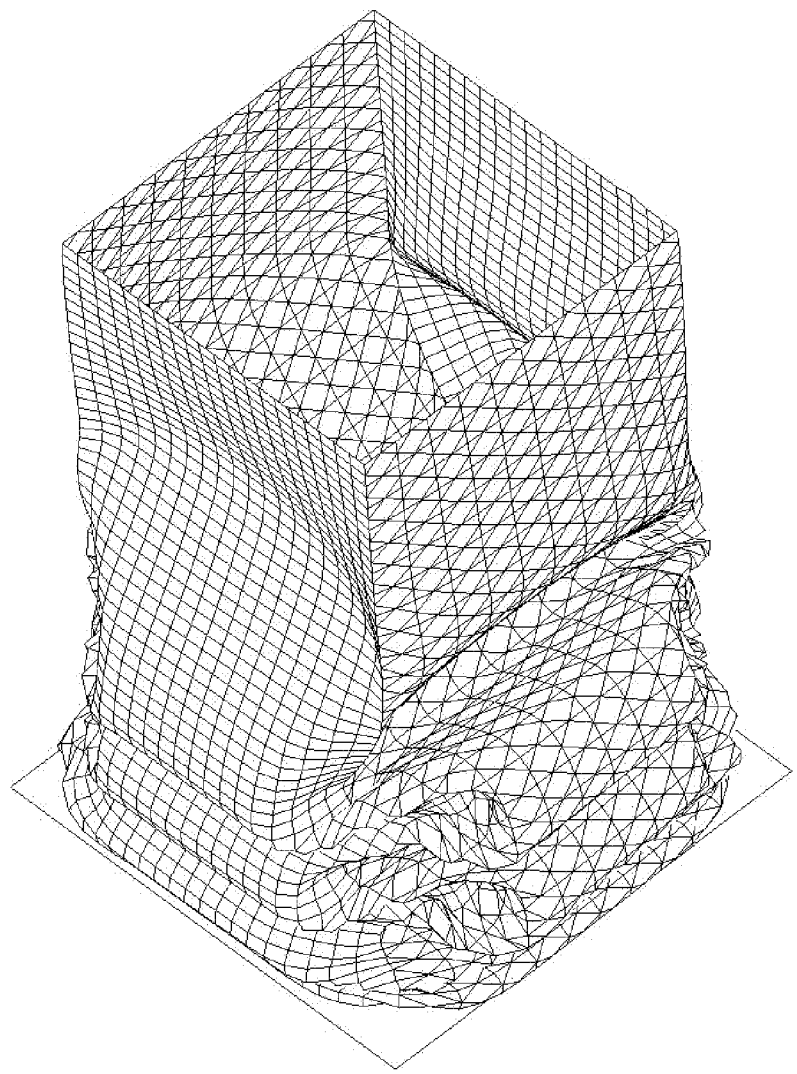
FIG. 8B is a diagram showing deformed configuration of the FEA model of FIG. 7A with contact segments.

FIGS. 8A and 8B are diagrams showing contact segments instead of finite elements for the same configurations of FIGS. 7A and 7B, respectively. Quadratic finite elements are replaced by 3-node contact segments 810. Low order linear finite elements are represented by 4-node contact segments 820 in accordance with the partition scheme shown in FIG. 6C.

Figure 9:
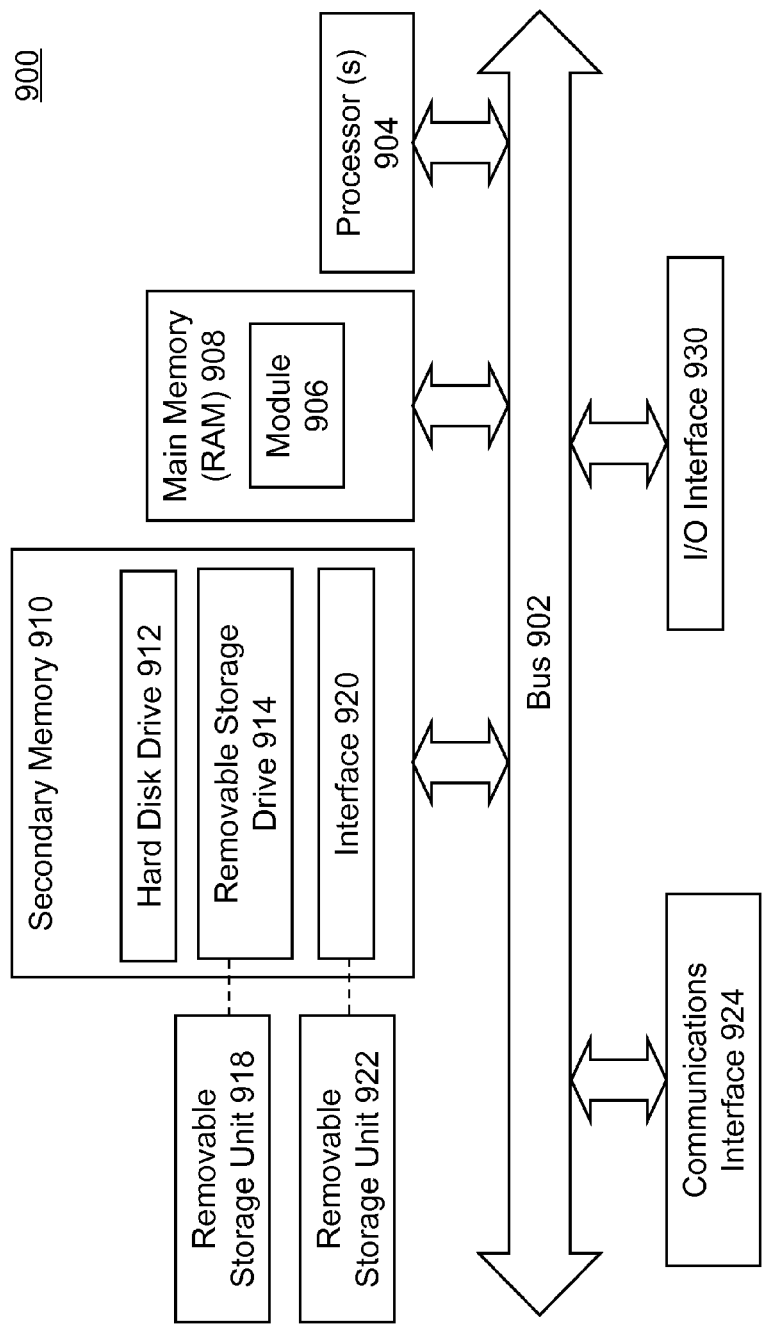
FIG. 9 is a function diagram showing salient components of an exemplary computer system, in which an embodiment of the present invention may be implemented.

According to one aspect, the present invention is directed towards one or more computer systems capable of carrying out the functionality described herein. An example of a computer system 900 is shown in FIG. 9. The computer system 900 includes one or more processors, such as processor 904. The processor 904 is connected to a computer system internal communication bus 902. Various software embodiments are described in terms of this exemplary computer system. After reading this description, it will become apparent to a person skilled in the relevant art(s) how to implement the invention using other computer systems and/or computer architectures.

Computer system 900 also includes a main memory 908, preferably random access memory (RAM), and may also include a secondary memory 910. The secondary memory 910 may include, for example, one or more hard disk drives 912 and/or one or more removable storage drives 914, representing a floppy disk drive, a magnetic tape drive, an optical disk drive, etc. The removable storage drive 914 reads from and/or writes to a removable storage unit 918 in a well-known manner. Removable storage unit 918, represents a floppy disk, magnetic tape, optical disk, etc. which is read by and written to by removable storage drive 914. As will be appreciated, the removable storage unit 918 includes a computer readable medium having stored therein computer software and/or data.

In alternative embodiments, secondary memory 910 may include other similar means for allowing computer programs or other instructions to be loaded into computer system 900. Such means may include, for example, a removable storage unit 922 and an interface 920. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 922 and interfaces 920 which allow software and data to be transferred from the removable storage unit 922 to computer system 900. In general, Computer system 900 is controlled and coordinated by operating system (OS) software, which performs tasks such as process scheduling, memory management, networking and I/O services.

There may also be a communications interface 924 connecting to the bus 902. Communications interface 924 allows software and data to be transferred between computer system 900 and external devices. Examples of communications interface 924 may include a modem, a network interface (such as an Ethernet card), a communications port, a Personal Computer Memory Card International Association (PCMCIA) slot and card, etc.

The computer 900 communicates with other computing devices over a data network based on a special set of rules (i.e., a protocol). One of the common protocols is TCP/IP (Transmission Control Protocol/Internet Protocol) commonly used in the Internet. In general, the communication interface 924 manages the assembling of a data file into smaller packets that are transmitted over the data network or reassembles received packets into the original data file. In addition, the communication interface 924 handles the address part of each packet so that it gets to the right destination or intercepts packets destined for the computer 900.

In this document, the terms "computer recordable storage medium", "computer recordable medium" and "computer readable medium" are used to generally refer to media such as removable storage drive 914, and/or a hard disk installed in hard disk drive 912. These computer program products are means for providing software to computer system 900. The invention is directed to such computer program products.

The computer system 900 may also include an input/output (I/O) interface 930, which provides the computer system 900 to access monitor, keyboard, mouse, printer, scanner, plotter, and alike.

Computer programs (also called computer control logic) are stored as application modules 906 in main memory 908 and/or secondary memory 910. Computer programs may also be received via communications interface 924. Such computer programs, when executed, enable the computer system 900 to perform the features of the present invention as discussed herein. In particular, the computer programs, when executed, enable the processor 904 to perform features of the present invention. Accordingly, such computer programs represent controllers of the computer system 900.

In an embodiment where the invention is implemented using software, the software may be stored in a computer program product and loaded into computer system 900 using removable storage drive 914, hard drive 912, or communications interface 924. The application module 906, when executed by the processor 904, causes the processor 904 to perform the functions of the invention as described herein.

The main memory 908 may be loaded with one or more application modules 906 that can be executed by one or more processors 904 with or without a user input through the I/O interface 930 to achieve desired tasks. In operation, when at least one processor 904 executes one of the application modules 906, the results are computed and stored in the secondary memory 910 (i.e., hard disk drive 912). The status of the time-marching engineering simulation (e.g., results due to impact, etc.) is reported to the user via the I/O interface 930 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the global searching schemes are described and shown using bucket sorting algorithm, other equivalent techniques can be used to accomplish the same. Additionally, whereas the exemplary partition schemes are shown in FIGS. 6A-6D, other equivalent schemes may be used to accomplish the same, for example, subdividing a surface by connecting corner nodes and center node. Finally, the exemplary FEA model of a hollow square column has been shown using the partition scheme shown in FIG. 6C. Other partition schemes may be used to accomplish the same, for example, the partition scheme shown in FIG. 6D. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method of numerically simulating structural behaviors of a product in an impact event comprising:

receiving, in a computer system having a finite element analysis (FEA) application module installed thereon, a FEA model representing the product to be used in a time-marching simulation of an impact event, the FEA model being organized in one or more groups of finite elements with each group, identified by a part identifier (ID), representing one of the product's parts and the FEA model being configured with one or more contact surface definitions, wherein each of the contact surface definitions comprises at least one of the groups;
determining which one or ones of the groups containing quadratic finite elements;
creating a new group for each determined group;
associating the newly created group with a unique part ID based on said each determined group's part ID;
generating contact segments for the newly created group in accordance with a set of predefined rules for subdividing one or more geometric shapes associated with the quadratic finite elements in said each determined group;
assigning element properties to said newly created group based on said quadratic finite elements' properties in said each determined group;
updating the contact surface definitions by replacing said each determined group with the newly created group; and
obtaining simulated structural behaviors of the product by conducting the time-marching simulation in the computer system using the FEA model along with the updated contact surface definitions for detecting contacts amongst the parts due to the impact event.

2. The method of claim 1, wherein each of the contact segments comprises a triangular or a quadrilateral surface.

3. The method of claim 1, wherein each of the quadratic finite elements comprises additional nodes to corner nodes.

4. The method of claim 3, wherein said additional nodes comprise mid-edge nodes located at mid-edge between two of the corner nodes.

5. The method of claim 4, wherein said set of predefined rules comprises subdividing said surface of said each of the quadratic finite elements by connecting two neighboring mid-edge nodes.

6. The method of claim 3, wherein said additional nodes further comprise a center node located at center of said each of the quadratic elements.

7. The method of claim 6, wherein said set of predefined rules comprises subdividing said surface of said each of the quadratic finite elements by connecting each of the mid-edge nodes with the center node.

8. The method of claim 1, wherein said unique part ID is created by adding a prefix or a postfix to the part ID of said each determined group.

9. A system for numerically simulating structural behaviors of a product in an impact event comprising:
a main memory for storing computer readable code for a finite element analysis application module;
at least one processor coupled to the main memory, said at least one processor executing the computer readable code in the main memory to cause the finite element analysis application module to perform operations by a method of:
receiving a FEA model representing a product to be used in a time-marching simulation of an impact event, the FEA model being organized in one or more groups of finite elements with each group, identified by a part identifier (ID), representing one of the product's parts and the FEA model being configured with one or more contact surface definitions, wherein each of the contact surface definitions comprises at least one of the groups;
determining which one or ones of the groups containing quadratic finite elements;
creating a new group for each determined group;
associating the newly created group with a unique part ID based on said each determined group's part ID;
generating contact segments for the newly created group in accordance with a set of predefined rules for subdividing one or more geometric shapes associated with the quadratic finite elements in said each determined group;
assigning element properties to said newly created group based on said quadratic finite elements' properties in said each determined group;
updating the contact surface definitions by replacing said each determined group with the newly created group; and
obtaining simulated structural behaviors of the product by conducting the time-marching simulation using the FEA model along with the updated contact surface definitions for detecting contacts amongst the parts due to the impact event.

10. The system of claim 9, wherein each of the quadratic finite elements comprises additional nodes to corner nodes.

11. The system of claim 10, wherein said additional nodes comprise mid-edge nodes located at mid-edge between two of the corner nodes and wherein said set of predefined rules comprises subdividing said surface of said each of the quadratic finite elements by connecting two neighboring mid-edge nodes.

12. The system of claim 10, wherein said additional nodes further comprise a center node located at center of said each of the quadratic elements and wherein said set of predefined rules comprises subdividing said surface of said each of the quadratic finite elements by connecting each of the mid-edge nodes with the center node.

13. A non-transitory computer readable storage medium containing instructions for numerically simulating structural behaviors of a product in an impact event by a method comprising:
receiving, in a computer system having a finite element analysis (FEA) application module installed thereon, a FEA model representing a product to be used in a time-marching simulation of an impact event, the FEA model being organized in one or more groups of finite elements with each group, identified by a part identifier (ID), representing one of the product's parts and the FEA model being configured with one or more contact surface definitions, wherein each of the contact surface definitions comprises at least one of the groups;
determining which one or ones of the groups containing quadratic finite elements;
creating a new group for each determined group;
associating the newly created group with a unique part ID based on said each determined group's part ID;
generating contact segments for the newly created group in accordance with a set of predefined rules for subdividing one or more geometric shapes associated with the quadratic finite elements in said each determined group;
assigning element properties to said newly created group based on said quadratic finite elements' properties in said each determined group;
updating the contact surface definitions by replacing said each determined group with the newly created group; and
obtaining simulated structural behaviors of the product by conducting the time-marching simulation in the computer system using the FEA model along with the updated contact surface definitions for detecting contacts amongst the parts due to the impact event.

14. The non-transitory computer readable storage medium of claim 13, wherein each of the quadratic finite elements comprises additional nodes to corner nodes.

15. The non-transitory computer readable storage medium of claim 14, wherein said additional nodes comprise mid-edge nodes located at mid-edge between two of the corner nodes and wherein said set of predefined rules comprises subdividing said surface of said each of the quadratic finite elements by connecting two neighboring mid-edge nodes.

16. The non-transitory computer readable storage medium of claim 14, wherein said additional nodes further comprise a center node located at center of said each of the quadratic elements and wherein said set of predefined rules comprises subdividing said surface of said each of the quadratic finite elements by connecting each of the mid-edge nodes with the center node.

* * * * *